US 6,565,721 B1

(12) United States Patent
Blalock et al.

(10) Patent No.: US 6,565,721 B1
(45) Date of Patent: May 20, 2003

(54) USE OF HEAVY HALOGENS FOR ENHANCED FACET ETCHING

(75) Inventors: Guy T. Blalock; Kevin G. Donohoe, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1088 days.

(21) Appl. No.: 08/948,179

(22) Filed: Oct. 9, 1997

Related U.S. Application Data

(63) Continuation of application No. 08/627,268, filed on Apr. 4, 1996, now abandoned.

(51) Int. Cl.$^7$ ................................................ C23C 14/34
(52) U.S. Cl. .......................... 204/192.37; 204/192.32
(58) Field of Search ........................ 204/192.32, 192.37

(56) References Cited

U.S. PATENT DOCUMENTS

| | | | | | |
|---|---|---|---|---|---|
| 4,444,635 A | * | 4/1984 | Kobayashi et al. | ...... | 204/298.2 |
| 4,744,861 A | * | 5/1988 | Matsunaga et al. | . | 204/192.37 X |
| 4,919,748 A | * | 4/1990 | Bredbenner et al. | ..... | 156/643.1 |
| 4,952,274 A | * | 8/1990 | Abraham | .................. | 156/643.1 |
| 5,203,957 A | * | 4/1993 | Yoo et al. | ................. | 156/643.1 |
| 5,254,214 A | * | 10/1993 | Hijikata et al. | .......... | 156/643.1 |
| 5,316,616 A | * | 5/1994 | Nakamura et al. | ........ | 156/643.1 |
| 5,346,585 A | | 9/1994 | Doan et al. | .............. | 156/643.1 |

OTHER PUBLICATIONS

S. Wolfe, et al., Silicon Processing for The VSLI Era, vol. 1, Process Technology, Lattice Press, p. 541–542.
S.J. Fonash, Advances in Dry Etching Processes—A Review; Solid State Technology, Jan. 1995, p. 150–152.

* cited by examiner

*Primary Examiner*—Steven H. VerSteeg
(74) *Attorney, Agent, or Firm*—Workman, Nydegger & Seeley

(57) ABSTRACT

An ion bombardment sputter etch of a layer to be etched is performed in an inert gas plasma including therein a small amount of a heavy halogen gas, such as iodine or bromine. The heavy halogen gas, in the form ions that are ionized by the plasma and halogen molecules, have the effect of bonding with the material of the layer to be etched, decreasing the sputter rate at areas normal to the ion bombardment, relative to the sputter rate at areas at an angle to the ion bombardmen. The redeposition rate of material sputtered from areas at an angle is also increased. A small amount of oxygen may also be included in the plasma to enhance the above effects.

28 Claims, 1 Drawing Sheet

USE OF HEAVY HALOGENS FOR ENHANCED FACET ETCHING

This application is a continuation of U.S. application Ser. No. 08/627,268, filed Apr. 4, 1996, for USE OF HEAVY HALOGENS FOR ENHANCED FACET ETCHING, now abandoned which is incorporated herein by reference.

THE FIELD OF THE INVENTION

The present invention relates to the manufacture of semiconductor devices. More particularly, the present invention is directed to the use of heavy halogens for enhanced facet etching during the manufacture of semiconductor devices.

THE RELEVANT TECHNOLOGY

Ion bombardment preferentially removes surfaces at an angle to the direction of the ion bombardment, as compared to surfaces normal to the direction of the ion bombardment. For example, the rate of removal of a surface at 45° to the ion bombardment direction, ("corner sputter rate"), can be as high as four times the rate of removal of a normal surface ("normal sputter rate"). This effect has found use in the manufacture of semiconductor devices in the form of facet etching, in which upper corners of raised structures on a surface of a semiconductor substrate are preferentially etched by ion bombardment to form "facets" at such corners. Some of the material sputtered from the facets redeposits at or near the lower portions of the raised structures, resulting in the creation of a prograde profile on the raised structures. Beneficial effects of a prograde profile include increased process yields through improved elimination of stringers, an increased ability to employ highly directional and highly selective processes when depositing and etching between said raised structures, and a decrease in the required amount of over-etch to prevent stringer formation.

The above advantages of facet etching can be enhanced if the ratio of the corner sputter rate to the normal sputter rate can be increased beyond 4:1. This is especially true as feature sizes decrease, which in turn increases the probability of etching through a layer at a normal surface, thereby damaging the underlying structure.

SUMMARY AND OBJECTS OF THE INVENTION

An object of the present invention is provide a method for facet etching,which method provides an increase in the ratio of the corner sputter rate to the normal sputter rate.

Another object of the present invention is to provide a method for facet etching) which method provides a decrease in the normal sputter rate to near zero.

Still another object of the present invention is to provide a method for facet etching, which method provides an increase in the redeposition rate of material sputtered from facets.

In accordance with the method of the present invention, facet etching of a layer to be etched is performed in an inert gas plasma including therein a small amount of a heavy halogen, such as iodine or bromine. The heavy halogen, in the form of ions that are ionized by the plasma and halogen molecules, has the effect of bonding with the material of the layer to be etched, and decreasing the normal sputter rate relative to the corner sputter rate. The redeposition rate of material sputtered from the corners is also enhanced. A small amount of oxygen may also be included in the plasma to enhance the above effects.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered with reference to specific applications thereof which are illustrated in part in the appended drawings. Understanding that these drawings depict only typical applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
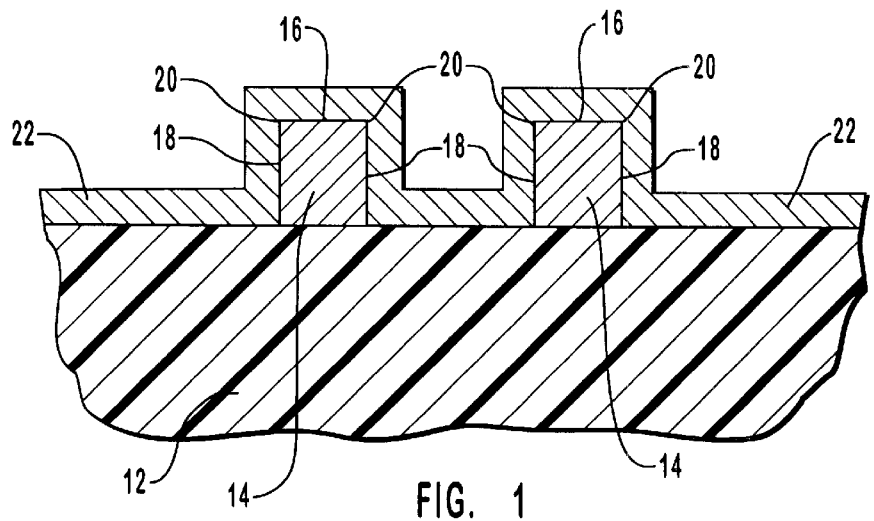
FIG. 1 is a cross section of a partially completed semiconductor device prepared for facet etching according to the methods of the present invention.

The present invention provides an improved method of facet etching by which the ratio of a corner etch rate at a facet to a normal etch rate at a surface normal to an ion bombardment in a sputter etch is greater than 4:1. Ratios as great as 75:1 and greater have been achieved by the methods of the present invention described below. For the practice of the present invention, as shown in FIG. 1 by way of example, a substrate 12 is provided having raised structures 14 on a surface thereof. Raised structures 14 have tops 16 and sides 18 and upper corners 20 at junctions of tops 16 and sides 18. Raised structures 14 may be any raised structures formed during the fabrication of a semiconductor device, including but not limited to gate stacks and similar structures, and may be formed by any appropriate process. A layer 22 of a material to be facet etched is formed conformably over raised structures 14 and substrate 12 by any suitable process. Layer 14 may be comprised of any material which it is desired to facet etch, but is typically comprised of an oxide of silicon.

Layer 22 is then etched in a plasma comprising an inert gas and a heavy halogen such as bromine or iodine. Any suitable inert gas may be employed, with argon and gases of greater mass presently most preferred. Mixtures of inert gases may also be employed.

As with other facet etching, substrate 12 is negatively biased to accelerate ions toward the substrate in a direction normal to the surface thereof. Only a relatively small amount of the heavy halogen is required, preferably not more than 20% of the total gas flow for iodine, most preferably not more than 10%, and preferably not more than 30% of the total gas flow for bromine, and most preferably not more than 15%. Where the heavy halogen gas is iodine, the gas mixture may comprise an inert gas, oxygen gas, and an amount of iodine gas that is not more than 10% of the gas mixture by volume, preferably not more than 5%. Where the heavy halogen gas is a bromine gas, the gas mixture may comprise an inert gas, oxygen gas, and an amount of bromine gas and oxygen gas that is not more than 20% of the gas mixture by volume, preferably not more than 10%. The heavy halogen forms low volatility compounds with the material of layer 22, decreasing the sputter yield of layer 22. The sputter yield is decreased fairly uniformly across all surfaces regardless of the particular angle of the surface to the direction of bombardment, resulting in a proportionately greater decrease in the sputter yield at surfaces normal to the direction of bombardment. This results in less removal of layer 22 at substrate 12, and proportionately more removal of layer 22 at upper corners 20.

Figure 2:
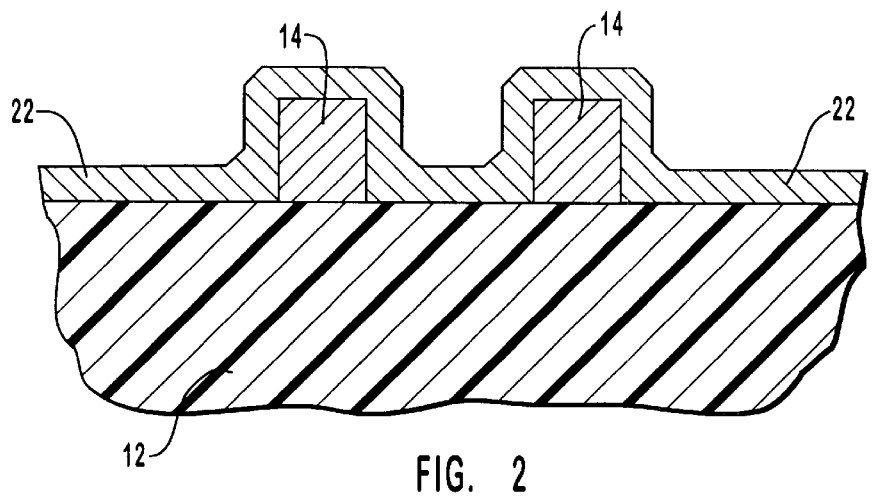
FIG. 2 is a cross section of the structure shown in FIG. 1 after facet etching according to the methods of the present invention.

The effects of this inventive etch process are shown in FIG. 2. FIG. 2 is the cross section of FIG. 1 after etching according to the methods of the present invention. Layer 22 has been etched little or not at all at areas overlying substrate 12, while substantial facet etching has occurred in layer 22 at upper corners 20 of raised structures 14.

The inventive technique for facet formation provides a benefit of an increased surface area for the top surfaces of structures formed between corners that are faceted by the inventive process, such as the top surfaces of contact plugs formed between faceted corners of gate stacks.

Figure 3:
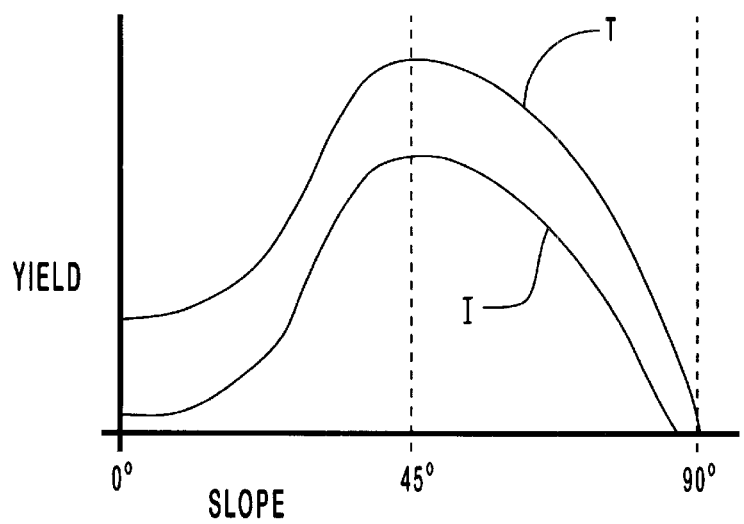
FIG. 3 is a graph of a sputter yield curve illustrating the effects of the methods of the present invention.

The effects of the etch processes of the present invention are further illustrated in FIG. 3. FIG. 3 is the graph of the sputter yield rate of a surface as a function of the slope of the surface, a surface normal to the ion bombardment having a slope of 0°.

Curve T is the graph for a typical facet etch. At 90° on curve T, the surface is perpendicular to a surface normal to the ion bombardment, so the sputter yield is zero, but at 0°, the yield is a significant fraction of the yield at 45°.

Curve I is the graph for a facet etch of the present invention. The entire curve is lowered essentially uniformly at all points, resulting in a yield at 0° which is a much lower fraction of the yield at 45°. This permits the use of facet etching with very small feature sizes because the danger of damaging substrate 12 by etching through layer 22 is substantially reduced.

The methods of the present invention have the additional beneficial effect of increasing the redeposition rate at the lower corners of raised structures 14, improving the formation of a prograde profile in layer 22 over raised structures 14, as shown in FIG. 2.

As an optional component of the methods of the present invention, a small amount of an oxygen gas may be included in the plasma. The oxygen gas has a further slowing effect on the overall sputter yield by reacting with silicon halide compounds to form a passivating layer of silicon dioxide in reaction of the general form $SiB_4+O_2 \rightarrow 2SiO_2+2Br_2$ for bromine, for example.

Both bromine and iodine constitute heavy halogens and are useful in the present invention. Iodine is presently preferred because of its larger mass and consequent lower volatility. Bromine and iodine may also be used in combination.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of facet etching for use during the fabrication of a semiconductor device, said method comprising:

providing a substrate with raised structures on a surface thereof, said raised structures having tops and sides and upper corners at junctions of said tops and said sides, and said substrate and said raised structures being covered conformably with an etching layer of a material to be facet etched; and sputter etching said etching layer in a plasma including an inert gas, and a heavy halogen gas, wherein the heavy halogen gas is present in the plasma in a sufficient amount such that the sputtering ratio of the sputter rate of said etching layer at the upper corners of said raised structures to the sputter rate of said etching layer at said substrate is greater than 4:1.

2. The method as defined in claim 1, wherein the sputtering ratio is greater than 5:1.

3. The method as defined in claim 2, wherein the sputtering ratio is greater than 20:1.

4. The method as defined in claim 3, wherein the sputtering ratio is greater than 50:1.

5. The method as defined in claim 1, wherein the heavy halogen gas is iodine.

6. The method as defined in claim 5, wherein sputter etching said etching layer in a plasma comprises the step of feeding to said plasma a gas mixture, said gas mixture comprising an inert gas and an amount of iodine gas that is not more than 20% of the gas mixture by volume.

7. The method as defined in claim 6, wherein, said gas mixture comprises an inert gas and an amount of iodine gas that is not more than 10% of the gas mixture by volume.

8. The method as defined in claim 1, wherein the heavy halogen gas is bromine.

9. The method as defined in claim 8, wherein sputter etching said etching layer in a plasma comprises the step of feeding to said plasma a gas mixture, said gas mixture comprising an inert gas and an amount of bromine gas that is not more than 30% of the gas mixture by volume.

10. The method as defined in claim 8, wherein said gas mixture comprises an inert gas and an amount of bromine gas that is not more than 15% of the gas mixture by volume.

11. The method as defined in claim 1, wherein said plasma further comprises a second inert gas.

12. The method as defined in claim 1, wherein said plasma further comprises a second heavy halogen gas.

13. The method as defined in claim 1, wherein said material of said etching layer to be facet etched comprises an oxide of silicon.

14. A method of facet etching for use during the fabrication of a semiconductor device, said method comprising:

providing a substrate with raised structures on a surface thereof, said raised structures having tops and sides and upper corners at junctions of said tops and said sides, and said substrate and said raised structures being covered conformably with an etching layer of an oxide of silicon to be facet etched; and sputter etching said etching layer in a plasma including an inert gas, and a heavy halogen gas, wherein the heavy halogen gas is present in the plasma in a sufficient amount such that the sputtering ratio of the sputter rate of said etching layer at the upper corners of said raised structures to the sputter rate of said etching layer at said substrate is greater than 5:1.

15. A method of facet etching for use during the fabrication of a semiconductor device, said method comprising:

providing a substrate with raised structures on a surface thereof, said raised structures having tops and sides and upper corners at junctions of said tops and said sides, and said substrate and said raised structures being covered conformably with an etching layer of a material to be facet etched; and sputter etching said etching layer in a plasma including a gas mixture of an inert gas, an oxygen gas, and an amount of heavy halogen gas that is not more than 30% of the gas mixture by volume, wherein the oxygen gas and the heavy halogen gas are present in the plasma in a sufficient amount such that the sputtering ratio of a sputter rate of said etching layer at the upper corners of said raised structures to the sputter rate of said etching layer at said substrate is greater than 4:1.

16. The method as defined in claim 15, wherein the sputtering ratio is greater than 5:1.

17. The method as defined in claim 16, wherein the sputtering ratio is greater than 20:1.

18. The method as defined in claim 17, wherein the sputtering ratio is greater than 50:1.

19. The method as defined in claim 15, wherein the heavy halogen gas is iodine.

20. The method as defined in claim 19, wherein sputter etching said etching layer in a plasma comprises the step of feeding to said plasma a gas mixture, said gas mixture comprising an inert gas, oxygen gas, and an amount of iodine gas is not more than 10% of the gas mixture by volume.

21. The method as defined in claim 20, wherein the amount of iodine gas is not more than 5% of the gas mixture by volume.

22. The method as defined in claim 15, wherein the heavy halogen gas is a bromine gas.

23. The method as defined in claim 22, wherein sputter etching said etching layer in a plasma comprises the step of feeding to said plasma a gas mixture, said gas mixture comprising an inert gas, oxygen gas, and an amount of bromine gas is not more than 20% of the gas mixture by volume.

24. The method as defined in claim 23, wherein the amount of bromine gas is not more than 10% of the gas mixture by volume.

25. The method as defined in claim 15, wherein said plasma further comprises a second inert gas.

26. The method as defined in claim 15, wherein said plasma further comprises a second heavy halogen gas.

27. The method as defined in claim 15, wherein said material of said etching layer to be facet etched comprises an oxide of silicon.

28. A method of facet etching for use during the fabrication of a semiconductor device, said method comprising:

providing a substrate with a raised structure on a surface thereof, said raised structure having a top, at least one side, and at least one upper corner junction of said top and said at least one side, said raised structure to be facet etched; and sputter etching said raised structure in a plasma including an inert gas, and a heavy halogen gas.

* * * * *

UNITED STATES PATENT AND TRADEMARK OFFICE
CERTIFICATE OF CORRECTION

PATENT NO.     : 6,565,721 B1
DATED          : May 20, 2003
INVENTOR(S)    : Guy T. Blalock and Kevin G. Donohoe It is certified that error appears in the above-identified patent and that said Letters Patent is hereby corrected as shown below:

Column 1,
Line 51, delete ")"
Line 63, delete "and"

Column 4,
Line 27, after "wherein" delete ","

Signed and Sealed this

Twenty-fifth Day of November, 2003

JAMES E. ROGAN
*Director of the United States Patent and Trademark Office*